(12) United States Patent
Chen

(10) Patent No.: US 9,013,043 B2
(45) Date of Patent: Apr. 21, 2015

(54) SEMICONDUCTOR ELEMENT APPLICABLE TO OPTICAL PRODUCTS

(71) Applicant: Xintec Inc., Jhongli (TW)

(72) Inventor: Hung-Chang Chen, Jhongli (TW)

(73) Assignee: Xintec Inc., Taoyuan (TW)

( * ) Notice: Subject to any disclaimer, the term of this patent is extended or adjusted under 35 U.S.C. 154(b) by 0 days.

(21) Appl. No.: 13/667,811

(22) Filed: Nov. 2, 2012

(65) Prior Publication Data

US 2013/0119551 A1    May 16, 2013

Related U.S. Application Data

(60) Provisional application No. 61/555,827, filed on Nov. 4, 2011.

(51) Int. Cl.
*H01L 23/488* (2006.01)
*H01L 23/00* (2006.01)
*H01L 27/146* (2006.01)

(52) U.S. Cl.
CPC .............. *H01L 23/488* (2013.01); *H01L 24/02* (2013.01); *H01L 27/14618* (2013.01)

(58) Field of Classification Search
CPC . H01L 27/14618; H01L 24/02; H01L 23/488; H01L 23/00
See application file for complete search history.

(56) References Cited

U.S. PATENT DOCUMENTS

2010/0080006 A1* 4/2010 Shaikevitch et al. .......... 362/317
2011/0042731 A1* 2/2011 Ho et al. ...................... 257/296

FOREIGN PATENT DOCUMENTS

TW         200741829         11/2007

* cited by examiner

*Primary Examiner* — Thao X Le
*Assistant Examiner* — Long Le
(74) *Attorney, Agent, or Firm* — Liu & Liu

(57) ABSTRACT

A semiconductor element includes: a transparent substrate; a stack structure formed on the transparent substrate and having a metal oxide layer partially exposed through sidewalls of the stack structure; a plurality of leads spacingly formed on the stack structure and extending to the sidewalls of the stack structure; an insulating film covering the exposed portions of the metal oxide layer; a metal film formed on the leads; and a solder mask layer disposed on the metal film, the stack structure and the insulating film. As such, the insulating film prevents short circuits from occurring between adjacent leads so as to improve the product yield.

16 Claims, 5 Drawing Sheets

US 9,013,043 B2

SEMICONDUCTOR ELEMENT APPLICABLE TO OPTICAL PRODUCTS

CROSS-REFERENCE TO RELATED APPLICATIONS

This application claims priority under 35 U.S.C. §119(e) to U.S. Provisional Patent Application Ser. No. 61/555,827, filed Nov. 4, 2011. The entire content of the above-referenced patent application is hereby incorporated by reference herein.

BACKGROUND OF THE INVENTION

1. Field of the Invention

The present invention relates to semiconductor elements and fabrication methods thereof, and more particularly, to a semiconductor element applicable to optical products and a fabrication method of the semiconductor element.

2. Description of Related Art

Along with the rapid development of electronic industries, electronic products are integrated with more and more functions. In particular, semiconductor elements having optical characteristics are required in some electronic products. To fabricate such a semiconductor element, a wafer having circuits is mounted on a transparent substrate and then a singulation process is performed to the wafer and the transparent substrate so as to obtain a plurality of chips. As such, each of the chips has a transparent medium disposed at one side thereof. The transparent medium allows light to transmit therethrough.

FIG. 3 shows a conventional fabrication method of the semiconductor element. Referring to FIG. 3, a transparent substrate 30 is provided and a silicon material 31 is disposed on the transparent substrate 20 through an adhesive layer 32. Preferably, the transparent substrate 30 further has a metal oxide layer 33 formed thereon for filtering out light radiation noise. Furthermore, a plurality of grooves 310 are formed in the silicon material 31 for exposing portions of the transparent substrate 30 from bottoms of the grooves 310 and exposing portions of the metal oxide layer 33 from sidewalls of the grooves 310. Then, a plurality of leads 34 are formed on the silicon material 31 and extend to the sidewalls of the grooves 310. Subsequently, each of the leads 34 is covered with a metal film such as a Ni/Au alloy and a solder mask layer (not shown) is further formed on the silicon material to thereby obtain a semiconductor element.

However, during the fabrication processes, a metalloid material 36 can be grown on or adsorbed to the exposed portions of the metal oxide layer 33, thus easily causing a short circuit to occur between adjacent leads.

Therefore, there is a need to provide a semiconductor element and a fabrication method thereof so as to overcome the above-described drawbacks.

SUMMARY OF THE INVENTION

In view of the above-described drawbacks, the present invention provides a fabrication method of a semiconductor element, which comprises the steps of providing a transparent substrate and forming a stack structure on the transparent substrate, wherein the stack structure comprises a metal oxide layer, an adhesive layer and a semiconductor layer sequentially stacked on the transparent substrate, and a plurality of grooves are formed in the stack structure such that portions of the metal oxide layer are exposed through sidewalls of the grooves; forming a conductor layer on a top surface of the stack structure and in the grooves; patterning the conductor layer to form a plurality of leads and partially expose the top surface of the stack structure and the sidewalls of the grooves; forming an insulating film to cover the exposed portions of the metal oxide layer; forming a metal film on the leads; and forming a solder mask layer on the metal film, the top surface of the stack structure and the insulating film and in the grooves, wherein a plurality of openings are formed in the solder mask layer for exposing portions of the metal film on the leads on the top surface of the stack structure.

According to the above-described method, the present invention further provides a semiconductor element, which comprises: a transparent substrate; a stack structure disposed on the transparent substrate, wherein the stack structure comprises a metal oxide layer, an adhesive layer and a semiconductor layer sequentially stacked on the transparent substrate, and a plurality of grooves are disposed in the stack structure such that portions of the metal oxide layer are exposed through sidewalls of the grooves; a plurality of leads spacingly disposed on a top surface of the stack structure and extending to the sidewalls of the grooves; an insulating film covering the exposed portions of the metal oxide layer; a metal film disposed on the leads; and a solder mask layer disposed on the metal film, the top surface of the stack structure and the insulating film and in the grooves, wherein a plurality of openings are disposed in the solder mask layer for exposing portions of the metal film on the leads on the top surface of the stack structure.

By singulating the above-described semiconductor element, the present invention provides a singulated semiconductor element, which comprises: a transparent substrate; a stack structure disposed on the transparent substrate, wherein the stack structure comprises a metal oxide layer, an adhesive layer and a semiconductor layer sequentially stacked on the transparent substrate, and portions of the metal oxide layer are exposed through sidewalls of the stack structure; a plurality of leads spacingly disposed on a top surface of the stack structure and extending to the sidewalls of the stack structure; an insulating film covering the exposed portions of the metal oxide layer; a metal film disposed on the leads; and a solder mask layer disposed on the metal film, the top surface and sidewalls of the stack structure and the insulating film, wherein a plurality of openings are disposed in the solder mask layer for exposing portions of the metal film on the leads on the top surface of the stack structure.

The present invention further provides another fabrication method of a semiconductor element, which comprises the steps of: providing a transparent substrate and forming a stack structure on the transparent substrate, wherein the stack structure comprises a metal oxide layer, an adhesive layer and a semiconductor layer sequentially stacked on the transparent substrate, and a plurality of grooves are formed in the stack structure such that portions of the metal oxide layer are exposed through sidewalls of the grooves; forming an insulating film to cover the exposed portions of the metal oxide layer; forming a conductor layer on a top surface of the stack structure, in the grooves and on the insulating film; patterning the conductor layer to form a plurality of leads and partially expose the top surface of the stack structure, the sidewalls of the grooves and the insulating film; forming a metal film on the leads; and forming a solder mask layer on the metal film, the top surface of the stack structure and in the grooves, wherein a plurality of openings are formed in the solder mask layer for exposing portions of the metal film on the leads on the top surface of the stack structure.

Therefore, the present invention forms the insulating film to cover the exposed portions of the metal oxide layer so as to prevent growth or adsorption of any metalloid material on the metal oxide layer during subsequent processes such as forming the metal film on the leads, thereby preventing a short circuit from occurring between adjacent leads and improving the product yield.

BRIEF DESCRIPTION OF DRAWINGS

FIGS. 1A to 1F are schematic views showing a fabrication method of a semiconductor element according to a first embodiment of the present invention, wherein FIG. 1D is a cross-sectional view taken along a line 1C-1C of FIG. 1C, and FIG. 1E is a cross-sectional view taken along a line 1C'-1C' of FIG. 1C;

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as 'top', 'side', 'on', 'a' etc. are only used as a matter of descriptive convenience and not intended to have any other significance or provide limitations for the present invention.

First Embodiment

FIGS. 1A to 1F are schematic views showing a fabrication method of a semiconductor element according to a first embodiment of the present invention.

Figure 1A:
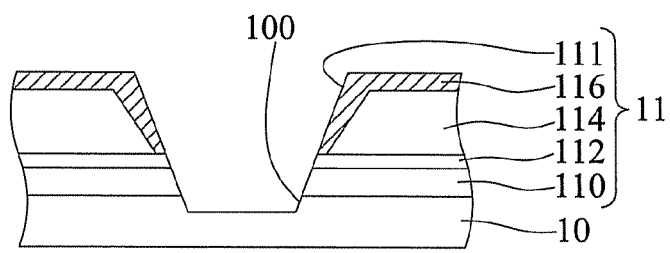

Referring to FIG. 1A, a transparent substrate 10 is provided and a stack structure 11 is formed on the transparent substrate 10. The stack structure 11 has a metal oxide layer 110, an adhesive layer 112 and a semiconductor layer 114 sequentially stacked on the transparent substrate 10. A plurality of grooves 111 are formed in the stack structure 11 such that portions of the metal oxide layer 110 are exposed through sidewalls of the grooves 111. The stack structure 11 can further have a photoresist layer 116, which constitutes portions of the sidewalls of the grooves 111 above the adhesive layer 112 to so as to encapsulate the semiconductor layer 114. The semiconductor layer 114 can be made of, but not limited to, a silicon wafer.

Further, a plurality of recesses 100 are formed in the transparent substrate 10 and in respective communication with bottoms of the grooves 111.

Figure 1B:
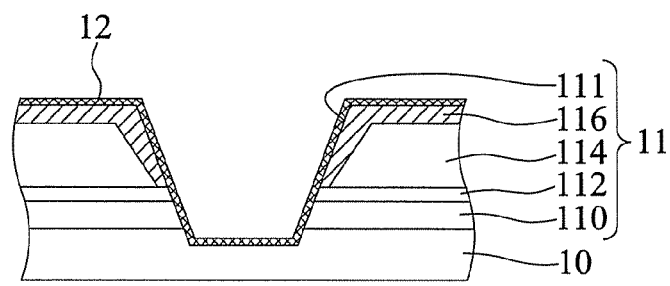

Referring to FIG. 1B, a conductor layer 12 is formed on a top surface of the stack structure 11 and in the grooves 111. The conductor layer 12 can be made of, but not limited to, aluminum.

Figure 1C:
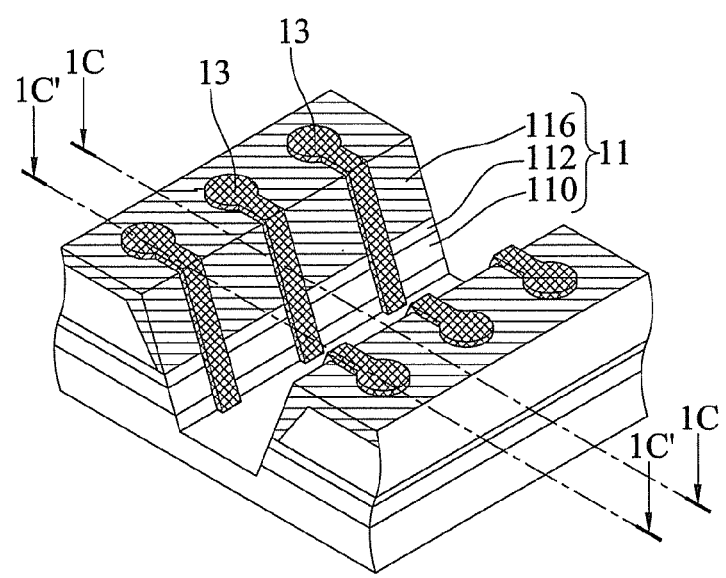

Referring to FIG. 1C, the conductor layer 12 is patterned to form a plurality of leads 13 and partially expose the top surface of the stack structure 11 and the sidewalls of the grooves 111. In the present embodiment, the leads 13 extend to the metal oxide layer 110. In an embodiment, the leads 13 are electrically connected to circuits of the semiconductor layer 114, for example, circuits on a bottom surface of the semiconductor layer 114. Since the electrical connection techniques are well known in the art, detailed description thereof is omitted herein.

Figure 1D:
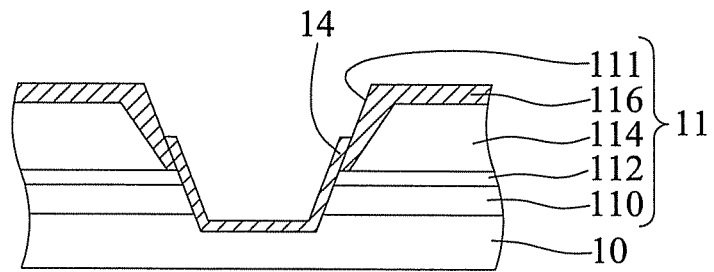

Referring to FIG. 1D, which is a cross-sectional view taken along a line 1C-1C of FIG. 1C, an insulating film 14 is formed to cover the metal oxide layer 110 exposed from the leads 13 and the sidewalls of the grooves 111. The insulating film 14 can be made of a photoresist material that is the same as that of the photoresist layer 116. The photoresist material can be formed in the grooves 111 and then patterned such that the insulating film 14 only covers the exposed portions of the metal oxide layer 110.

Figure 1E:
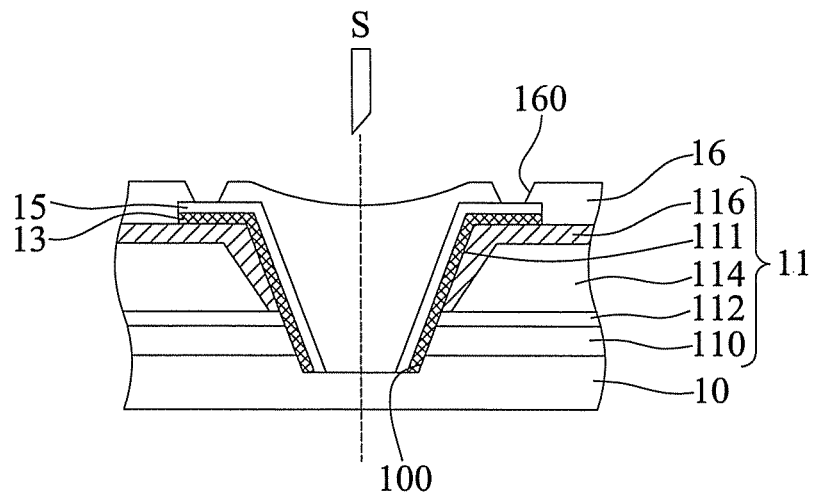

Referring to FIG. 1E, which is a cross-sectional view taken along a line 1C'-1C' of FIG. 1C, a metal film 15 made of such as a Ni/Au alloy is formed on the leads 13. A solder mask layer 16 is formed on the metal film 15, the top surface of the stack structure 11 and the insulating film 14 (not shown) and in the grooves 111, and a plurality of openings 160 are formed in the solder mask layer 16 such that portions of the metal film 15 on the leads 13 on the top surface of the stack structure 11 are exposed through the openings 160 for mounting solder balls. Then, a singulation process is performed along a line S so as to obtain a plurality of separated semiconductor elements, for example, chips.

The semiconductor element of FIG. 1E has: a transparent substrate 10; a stack structure 11 disposed on the transparent substrate 10, wherein the stack structure has a metal oxide layer 110, an adhesive layer 112 and a semiconductor layer 114 sequentially stacked on the transparent substrate 10 and a plurality of grooves 111 are disposed in the stack structure such that portions of the metal oxide layer 110 are exposed through sidewalls of the grooves 111; a plurality of leads 13 spacingly disposed on a top surface of the stack structure 11 and extending to the sidewalls of the grooves 111; an insulating film 14 covering the exposed portions of the metal oxide layer 110 (as shown in FIG. 1D); a metal film 15 disposed on the leads 13; and a solder mask layer 16 disposed on the metal film 15, the top surface of the stack structure 11 and the insulating film 14 and in the grooves 111, wherein a plurality of openings 160 are disposed in the solder mask layer 16 for exposing portions of the metal film 15 on the leads 13 on the top surface of the stack structure 11.

Further, the leads 13 can extend to the metal oxide layer 110 and the insulating film 14 can be disposed on the metal oxide layer 110 exposed from the leads 13 and the sidewalls of the grooves 111.

Furthermore, the transparent substrate 10 can have a plurality of recesses 100 disposed therein and in respective communication with the bottoms of the grooves 111. The stack structure 11 can further have a photoresist layer 116, which constitutes portions of the sidewalls of the grooves above the adhesive layer 112 so as to encapsulate the semiconductor layer 114.

Figure 1F:
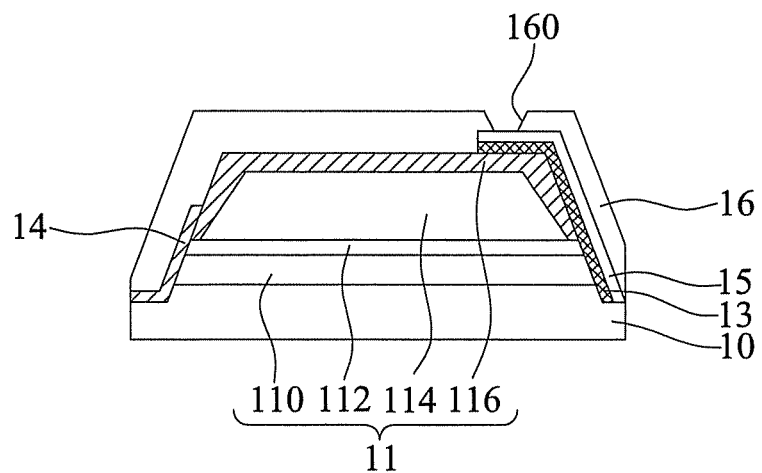

Referring to FIG. 1F, by performing the singulation process, a singulated semiconductor element is obtained. The semiconductor element has: a transparent substrate 10; a stack structure 11 disposed on the transparent substrate 10, wherein the stack structure 11 has a metal oxide layer 110, an adhesive layer 112 and a semiconductor layer 114 sequentially stacked on the transparent substrate 10, and portions of the metal oxide layer 110 are exposed through sidewalls of the stack structure 11; a plurality of leads 13 spacingly disposed on a top surface of the stack structure 11 and extending to the sidewalls of the stack structure 11; an insulating film 14 covering the exposed portions of the metal oxide layer 110; a metal film 15 disposed on the leads 13; and a solder mask layer 16 disposed on the metal film 15, the top surface and sidewalls of the stack structure 11 and the insulating film 14, wherein a plurality of openings 160 are disposed in the solder mask layer 16 for exposing portions of the metal film 15 on the leads 13 on the top surface of the stack structure 11.

Further, the leads 13 can extend to the metal oxide layer 110, and the insulating film 14 can be disposed on the metal oxide layer 110 exposed from the leads 13 and the sidewalls of the stack structure 11.

The stack structure 11 can further have a photoresist layer 116, which constitutes portions of the sidewalls of the stack structure 11 above the adhesive layer 112 so as to encapsulate the semiconductor layer 114.

Second Embodiment

FIGS. 2A to 2F show a fabrication method of a semiconductor element according to a second embodiment of the present invention. A main difference of the present embodiment from the first embodiment is that the insulating film is formed before formation of the conductor layer.

Figure 2A:
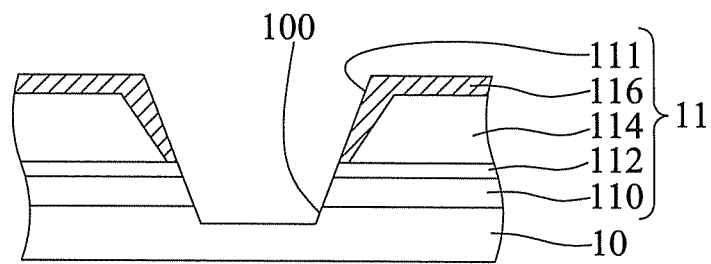
FIGS. 2A to 2F are schematic views showing a fabrication method of a semiconductor element according to a second embodiment of the present invention.

Referring to FIG. 2A, a transparent substrate 10 is provided and a stack structure 11 is formed on the transparent substrate 10. The stack structure 11 has a metal oxide layer 110, an adhesive layer 112 and a semiconductor layer 114 sequentially stacked on the transparent substrate 10. The stack structure 11 further has a plurality of grooves 111 formed therein such that portions of the metal oxide layer 110 are exposed through sidewalls of the grooves 111.

Figure 2B:
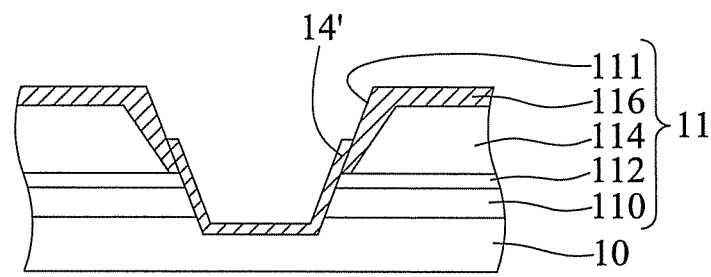

Referring to FIG. 2B, an insulating film 14' is formed to cover the exposed portions of the metal oxide layer 110.

Figure 2C:
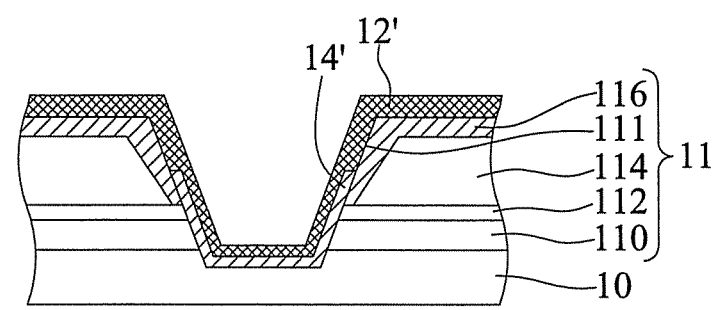

Referring to FIG. 2C, a conductor layer 12' is formed on a top surface of the stack structure 11, in the grooves 111 and on the insulating film 14'.

Figure 2D:
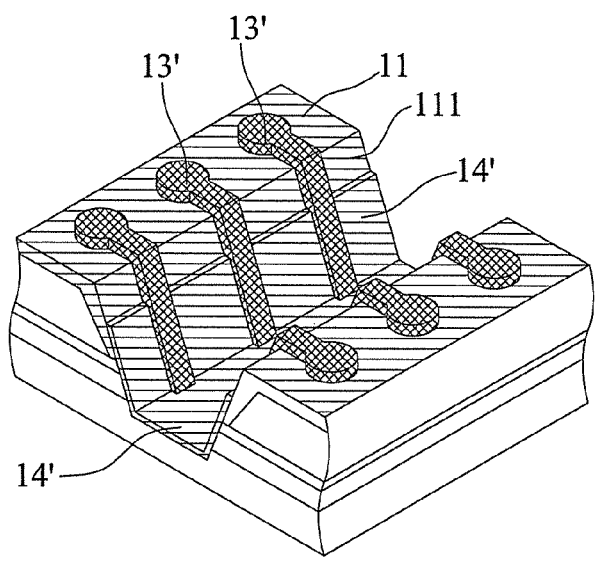

Referring to FIG. 2D, the conductor layer 12' is patterned to form a plurality of leads 13' and partially expose the top surface of the stack structure 11, the sidewalls of the grooves and the insulating film 14'.

Figure 2E:
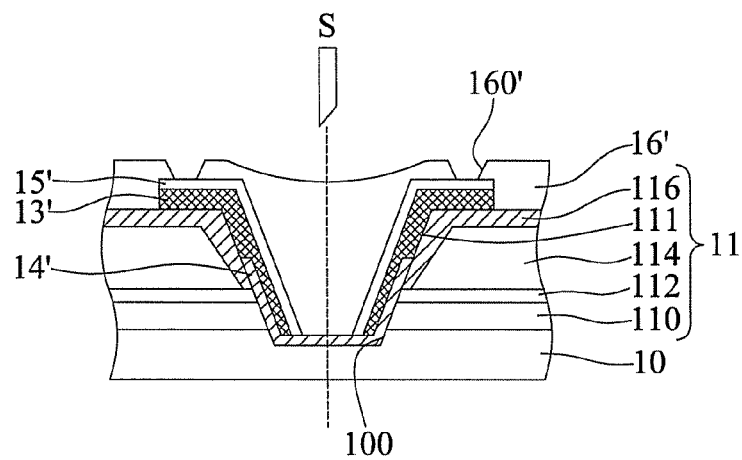

Referring to FIG. 2E, a metal film 15' is formed on the leads 13'. A solder mask layer 16' is formed on the metal film 15', the top surface of the stack structure 11 and in the grooves 111, and a plurality of openings 160' are formed in the solder mask layer 16' for exposing portions of the metal film 15' on the leads 13' on the top surface of the stack structure 11. Then, a singulation process is performed to obtain a plurality of separated semiconductor elements.

The semiconductor element of FIG. 2E has: a transparent substrate 10; a stack structure 11 disposed on the transparent substrate 10, wherein the stack structure has a metal oxide layer 110, an adhesive layer 112 and a semiconductor layer 114 sequentially stacked on the transparent substrate 10, and a plurality of grooves 111 are disposed in the stack structure such that portions of the metal oxide layer 110 are exposed through sidewalls of the grooves 111; an insulating film 14' covering the exposed portions of the metal oxide layer 110; a plurality of leads 13' spacingly disposed on a top surface of the stack structure 11 and extending to the metal oxide layer 110 such that portions of the insulating film 14' are disposed between the metal oxide layer 110 and the leads 13'; a metal film 15' disposed on the leads 13'; and a solder mask layer 16' disposed on the metal film 15', the top surface of the stack structure 11 and the insulating film 14' and in the grooves 111, wherein a plurality of openings 160' are disposed in the solder mask layer 16' for exposing portions of the metal film 15' on the leads 13' on the top surface of the stack structure 11.

Figure 2F:
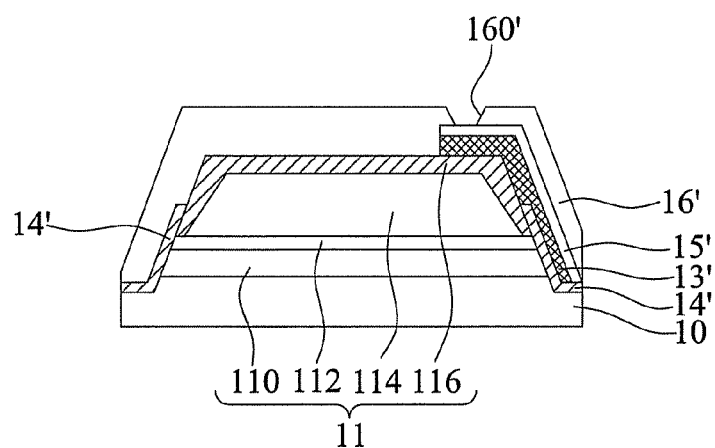
Figure 3:
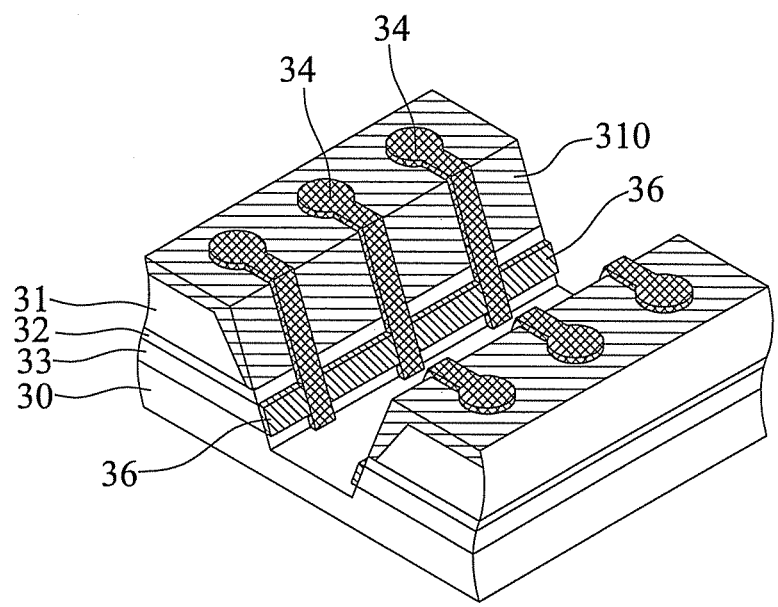
FIG. 3 is a schematic view showing a fabrication method of a semiconductor element according to the prior art.

Referring to FIG. 2F, a singulation process is performed to obtain a singulated semiconductor element similar to that of FIG. 1F. A main difference of the semiconductor element of the present embodiment from the first embodiment is the insulating film 14' is further formed between the metal oxide layer 110 and the leads 13'.

Therefore, by forming the insulating film to cover the exposed portions of the metal oxide layer, the present invention prevents growth or adsorption of any metalloid material on the metal oxide layer during subsequent processes such as forming the metal film on the leads, thereby preventing short circuits that would otherwise occur between adjacent leads due to the metalloid material as in the prior art. Consequently, the present invention improves the product yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor element, comprising:
   a transparent substrate;
   a stack structure disposed on the transparent substrate, wherein the stack structure comprises a metal oxide layer, an adhesive layer and a semiconductor layer sequentially stacked on the transparent substrate and a plurality of grooves are disposed in the stack structure such that portions of the metal oxide layer are exposed through sidewalls of the grooves, and wherein a plurality of recesses are formed in the transparent substrate and in respective communication with the bottoms of the grooves;
   a plurality of leads spacingly disposed on a top surface of the stack structure and extending to the sidewalls of the grooves;
   an insulating film covering the exposed portions of the metal oxide layer, but not covering the entire sidewalls of the grooves;
   a metal film disposed on the leads; and
   a solder mask layer disposed on the metal film, the top surface of the stack structure and the insulating film and in the grooves, wherein a plurality of openings are disposed in the solder mask layer for exposing portions of the metal film on the leads on the top surface of the stack structure.

2. The element of claim 1, wherein the leads extend to the metal oxide layer, and the insulating film is disposed on the metal oxide layer exposed from the leads and the sidewalls of the grooves.

3. The element of claim 1, wherein the leads extend to the metal oxide layer, and the insulating film is further disposed between the metal oxide layer and the leads.

4. The element of claim 1, wherein the stack structure further comprises a photoresist layer, which constitutes portions of the sidewalls of the grooves above the adhesive layer so as to encapsulate the semiconductor layer.

5. A semiconductor element, comprising:
   a transparent substrate;
   a stack structure disposed on the transparent substrate, wherein the stack structure comprises a metal oxide layer, an adhesive layer and a semiconductor layer sequentially stacked on the transparent substrate, and portions of the metal oxide layer are exposed through sidewalls of the stack structure, and wherein a plurality of recesses are formed in the transparent substrate and in respective communication with the bottoms of the grooves disposed in the stack structure;

a plurality of leads spacingly disposed on a top surface of the stack structure and extending to the sidewalls of the stack structure;

an insulating film covering the exposed portions of the metal oxide layer, but not covering the entire sidewalls of the stack structure;

a metal film disposed on the leads; and a solder mask layer disposed on the metal film, the top surface and sidewalls of the stack structure and the insulating film, wherein a plurality of openings are disposed in the solder mask layer for exposing portions of the metal film on the leads on the top surface of the stack structure.

6. The element of claim 5, wherein the leads extend to the metal oxide layer, and the insulating film is disposed on the metal oxide layer exposed from the leads and the sidewalls of the stack structure.

7. The element of claim 5, wherein the leads extend to the metal oxide layer, and the insulating film is further disposed between the metal oxide layer and the leads.

8. The element of claim 5, wherein the stack structure further comprises a photoresist layer, which constitutes portions of the sidewalls of the stack structure above the adhesive layer so as to encapsulate the semiconductor layer.

9. A fabrication method of a semiconductor element, comprising the steps of:

providing a transparent substrate and forming a stack structure on the transparent substrate, wherein the stack structure comprises a metal oxide layer, an adhesive layer and a semiconductor layer sequentially stacked on the transparent substrate, and a plurality of grooves are formed in the stack structure such that portions of the metal oxide layer are exposed through sidewalls of the grooves, and wherein a plurality of recesses are formed in the transparent substrate and in respective communication with the bottoms of the grooves;

forming a conductor layer on a top surface of the stack structure and in the grooves;

patterning the conductor layer to form a plurality of leads and partially expose the top surface of the stack structure and the sidewalls of the grooves;

forming an insulating film to cover the exposed portions of the metal oxide layer, but not covering the entire sidewalls of the grooves;

forming a metal film on the leads; and forming a solder mask layer on the metal film, the top surface of the stack structure and the insulating film and in the grooves, wherein a plurality of openings are formed in the solder mask layer for exposing portions of the metal film on the leads on the top surface of the stack structure.

10. The method of claim 9, wherein the leads extend to the metal oxide layer, and the insulating film is formed on the metal oxide layer exposed from the leads and the sidewalls of the grooves.

11. The method of claim 9, wherein the leads extend to the metal oxide layer, and the insulating film is further disposed between the metal oxide layer and the leads.

12. The method of claim 9, wherein the stack structure further comprises a photoresist layer, which constitutes portions of the sidewalls of the grooves above the adhesive layer so as to encapsulate the semiconductor layer.

13. A fabrication method of a semiconductor element, comprising the steps of:

providing a transparent substrate and forming a stack structure on the transparent substrate, wherein the stack structure comprises a metal oxide layer, an adhesive layer and a semiconductor layer sequentially stacked on the transparent substrate, and portions of the metal oxide layer are exposed through sidewalls of the stack structure, and wherein a plurality of recesses are formed in the transparent substrate and in respective communication with bottoms of grooves disposed in the stack structure;

forming an insulating film to cover the exposed portions of the metal oxide layer, but not covering the entire sidewalls of the stack structure;

forming a conductor layer on a top surface of the stack structure, in the grooves and on the insulating film;

patterning the conductor layer to form a plurality of leads and partially expose the top surface of the stack structure, the sidewalls of the stack structure and the insulating film;

forming a metal film on the leads; and forming a solder mask layer on the metal film, the top surface and sidewalls of the stack structure and the insulating film, wherein a plurality of openings are formed in the solder mask layer for exposing portions of the metal film on the leads on the top surface of the stack structure.

14. The method of claim 13, wherein the leads extend to the metal oxide layer, and the insulating film is disposed on the metal oxide layer exposed from the leads and the sidewalls of the stack structure.

15. The method of claim 13, wherein the leads extend to the metal oxide layer, and the insulating film is further disposed between the metal oxide layer and the leads.

16. The method of claim 13, wherein the stack structure further comprises a photoresist layer, which constitutes portions of the sidewalls of the stack structure above the adhesive layer so as to encapsulate the semiconductor layer.

* * * * *